(12) United States Patent
Trescher et al.

(10) Patent No.: US 7,773,380 B2
(45) Date of Patent: Aug. 10, 2010

(54) ELECTRICAL CONFIGURATION AS HEAT DISSIPATION DESIGN

(75) Inventors: Ulrich Trescher, Tuebingen (DE); Eckhard Schaefer, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/417,447

(22) Filed: Apr. 2, 2009

(65) Prior Publication Data

US 2009/0251866 A1 Oct. 8, 2009

(30) Foreign Application Priority Data

Apr. 3, 2008 (DE) ........................ 10 2008 000 971
Mar. 25, 2009 (DE) ........................ 10 2009 001 823

(51) Int. Cl.
*H05K 7/20* (2006.01)
(52) U.S. Cl. ........................ 361/707; 361/704; 257/712; 257/718; 257/719
(58) Field of Classification Search ........................ None
See application file for complete search history.

(56) References Cited

U.S. PATENT DOCUMENTS

| | | | |
|---|---|---|---|
| 4,314,311 A | 2/1982 | Seytre et al. | |
| 4,358,173 A | 11/1982 | Conrad | |
| 5,309,979 A | 5/1994 | Brauer | |
| 5,337,214 A * | 8/1994 | Lindsey et al. | 361/709 |
| 5,430,420 A * | 7/1995 | Maier | 335/16 |
| 6,690,582 B2 * | 2/2004 | Sumida | 361/752 |
| 6,714,414 B1 * | 3/2004 | Dubovsky et al. | 361/704 |
| 6,914,416 B2 * | 7/2005 | Thomas et al. | 320/136 |
| 7,393,236 B2 * | 7/2008 | Thompson et al. | 439/487 |
| 7,504,720 B2 * | 3/2009 | Nakatsu et al. | 257/712 |

FOREIGN PATENT DOCUMENTS

| | | |
|---|---|---|
| DE | 44 16 460 | 11/1995 |
| DE | 199 12 443 | 10/2000 |
| DE | 10 2007 012 501 | 9/2008 |
| DE | 10 2007 014 351 | 10/2008 |
| FR | 2 654 156 | 5/1991 |
| WO | 9213437 | 8/1992 |

* cited by examiner

*Primary Examiner*—Boris L Chervinsky
(74) *Attorney, Agent, or Firm*—Kenyon & Kenyon LLP

(57) ABSTRACT

An electrical configuration having at least one component which has at least one current bar, particularly a lead frame, and having an electronic circuit which has at least one heat dissipation surface and at least one electric terminal that is connected mechanically and electrically to the current bar. It is provided that the unit made up of the component and the electronic circuit is mounted on a support layer that effects the heat dissipation in such a way that, because of the fastening of the component onto the support layer, the heat dissipation surface is pushed against the support layer, based on the spring property of the current bar.

8 Claims, 1 Drawing Sheet

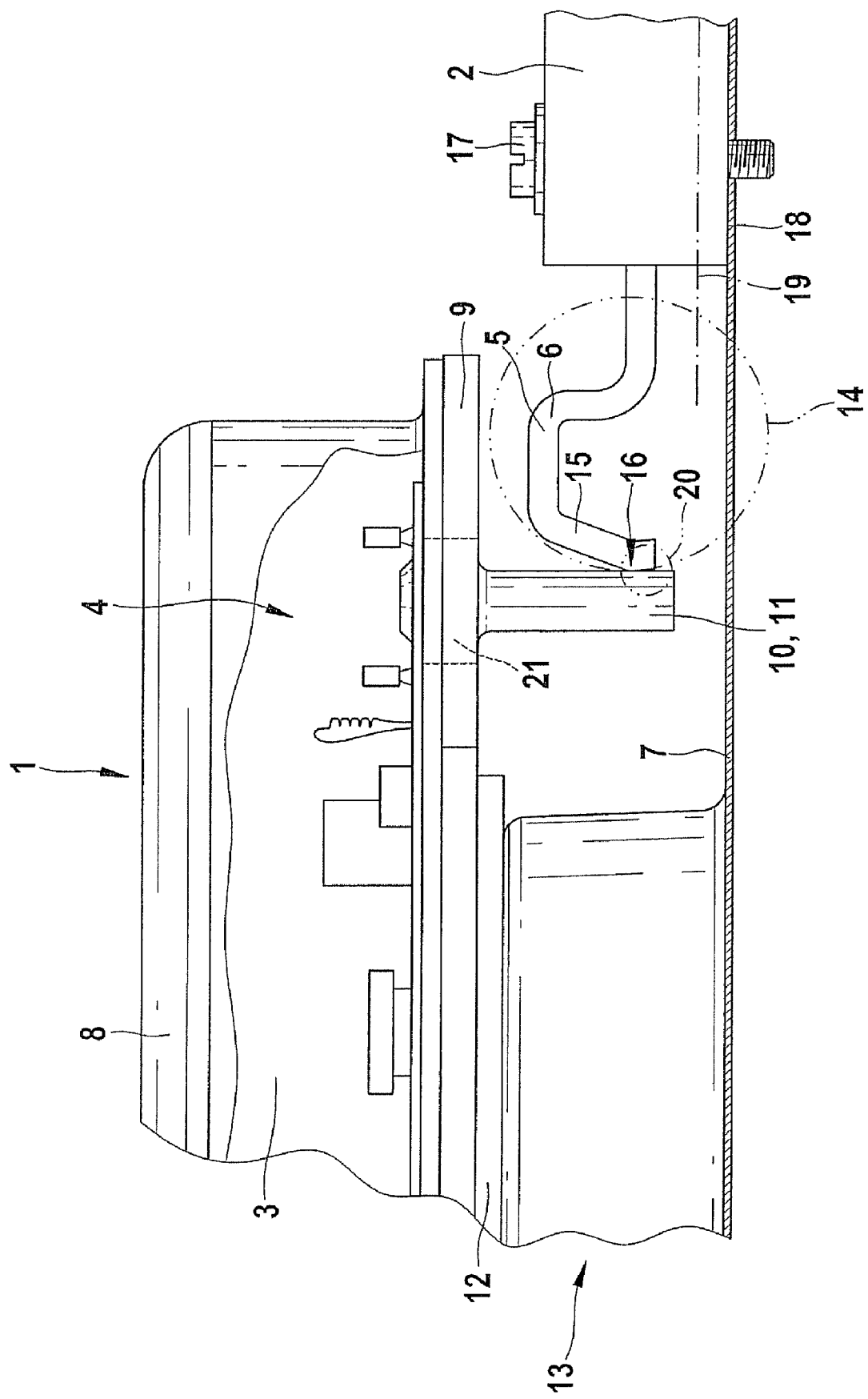

ELECTRICAL CONFIGURATION AS HEAT DISSIPATION DESIGN

RELATED APPLICATION INFORMATION

The present application claims priority to and the benefit of German patent application No. 102008000971.7, which was filed in Germany on Apr. 3, 2008, and of German patent application No. 102009001823.9, which was filed in Germany on Mar. 25, 2009, the disclosures of both of which are incorporated herein by reference.

FIELD OF THE INVENTION

The present invention relates to an electrical configuration having at least one component which has at least one current bar, particularly a lead frame, and having an electronic circuit which has at least one heat dissipation surface and at least one electric terminal that is connected mechanically and electrically to the current bar.

BACKGROUND INFORMATION

It is understood that one should especially protect electronic circuits, particularly those under hostile environmental conditions, as are present in automotive applications, for instance. One type of such a protection is represented by a hermetically sealed housing, in this instance, these hermetically sealed housings existing in different embodiments. Such electronic circuits situated in hermetically sealed housings are contacted electrically to the surroundings, for example, using glazed electric terminals, such as contact pins.

In this context, the contact pins and a glass blank are inserted on a base plate, a tight, electrically insulating composite between the contact pins and the base plate being created by the following melting of the glass at appropriate temperatures and the subsequent cooling. The housing is sealed in a hermetically tight fashion by tightly welding a cover onto the base plate, particularly under a protective atmosphere. The electronic circuits housed in hermetically sealed housings develop a power loss which has to be carried off to the environment by as good a heat coupling as possible. In the housings described, this is implemented by pressing the lower sides of the housings, especially of the base plate, onto a cooling surface situated separately from it. The press-on pressure is applied by an additional spring, in this instance. The seating should take place as free of gaps and as reliably as possible, in order to implement a good heat transfer to the cooling surface.

It is an object of the exemplary embodiment and/or exemplary method of the present invention to provide a novel, cost-effective possibility for a good thermal binding of the hermetically sealed housing to its environment.

SUMMARY OF THE INVENTION

An electrical configuration is proposed for this, having at least one component which has at least one current bar, particularly a lead frame, and having an electronic circuit which has at least one heat dissipation surface and at least one electric terminal that is connected mechanically and electrically to the current bar. It is provided, in this connection, that the unit made up of the component and the electronic circuit is mounted on a support layer that effects the heat dissipation in such a way that, because of the fastening of the component onto the support layer, the heat dissipation surface is pushed against the support layer based on the spring property of the current bar. The electronic circuit is accordingly connected mechanically and electrically to the at least one component via the current bar, namely, in particular, a lead frame. In this connection, the current bar has a spring property whereby, when the component is fastened on the support layer, the heat dissipation surface of the electronic circuit is pushed against the support layer, just because of this spring property of the current bar, or more particularly, it is pressed on. This is achieved, for example, by the component having such dimensions or such a geometry that it does not (fully) touch the support layer when it is only laid onto it.

For this purpose, the current bar may be made of a spring material, such as spring steel or a spring-elastic alloy.

In one specific embodiment, the electric terminal is an electric contact pin. Such contact pins are used in the related art for contacting hermetically housed electronic circuits, being glazed into the housing of the electronic circuit, so that an electrically insulating and hermetically sealed lead-through is implemented. As the material for such electric contact pins, alloys are considered, in particular, which are very suitable for the remelt process, for instance, resistant to enamel temperatures and which have good to very good electrical properties at the same time, and particularly a high current-carrying capability and a low resistance.

In one exemplary embodiment, the current bar has a U-shaped end region whose outer leg is connected to the electric terminal. Because of the formation of the U-shaped end region, one is able to achieve, in turn, an improved and/or strengthened spring action and spring elasticity, whereby a particularly favorable and operationally secure mounting of the heat dissipation surface on the support layer is able to take place. This U-shaped end region has an outer leg that is connected to the electric terminal, mechanically and electrically, in particular.

The outer leg may run in parallel, or at an acute angle to the longitudinal extension of the contact pin. By this we mean such an advantageous specific embodiment in which the outer leg runs in parallel to the longitudinal extension of the contact pin, at least in sections, or it demonstrates an acute-angled manner of running, at least in sections. The outer leg runs in parallel and at an acute angle to the longitudinal extension of the contact pin, in a particular manner, that is, it first runs in parallel in an end region of the outer leg, so that a good planar support is achieved, and then it runs at an acute angle, for the advantageous course of the application of force.

In another specific embodiment, the connection between the electric terminal and the current bar is a welded connection. Such welded connections effect an especially reliable, durable and yet thermally insensitive, and therefore very secure connection, which has not only a very good electrical conductivity, but in addition has an extraordinarily high mechanical reliability.

Additional advantageous specific embodiments are given by the dependent claims and by combinations of same.

The exemplary embodiment and/or exemplary method of the present invention is explained below with the aid of an exemplary embodiment, but is not limited to this.

BRIEF DESCRIPTION OF THE DRAWING

The FIGURE shows an electrical configuration according to the present invention.

DETAILED DESCRIPTION

The FIGURE shows an electrical configuration 1 having a component 2, which has a current bar 5, namely a lead frame 6, for the electrical contacting of an electronic circuit 4 that is situated adjacent to component 2 and is inserted into an hermetically sealed housing 3, both component 2 and housing 3 being situated on a support layer 7. Housing 3 is composed of a housing cover 8 and a base plate 9 closing it off, an electric terminal 10, namely a contact pin 11, passing through base plate 9 transversely, adjacently to current bar 5. Base plate 9 has a heat dissipation area 12, which rests upon support layer 7, but particularly, in fact, on an elevation 13 of support layer 7, in a planar manner. Component 2 and base plate 9, and especially heat dissipation area 12 associated with the latter, are situated, in this instance, in different, at least essentially parallel planes to one another, namely in such a way that heat dissipation area 12 lies higher than current bar 5 that is associated with contact pin 11.

Current bar 5 has an end region 14 that is developed essentially U-shaped, in such a way that the opening of the U points towards support layer 7. End region 14 has an outer leg 15, in this instance, which is electrically and mechanically connected to contact pin 11, and particularly is welded to it at a connecting location 16. Component 2 is held to support layer 7 by a screwed joint 17. Before putting in effect screw joint 17, that is, in the state of component 2 being detached from support layer 7, a component lower side 18 does not lie upon the plane of support layer 7 but on an elevated premounting plane 19, that is different from the latter, if housing 3 with heat dissipation area 12 is already lying on elevation 13 of support layer 7 over the complete surface. Since current bar 5 is welded to contact pin 11 in connecting location 16, component 2, with its component lower side 18, takes up a position in premounting plane 19. Now, if screw joint 17 is executed for fastening component 2 on support layer 7, current bar 5, and especially U-shaped end region 14 of current bar 5, is elastically deformed based on its spring properties, and is therefore prestressed, while component 2 is mounted on support layer 7 during the course of executing screw joint 17.

This has the effect of applying a force, via end region 14 of current bar 5, that is developed to be springy, and contact pin 11 welded to it, onto base plate 9, and with that, on housing 3, so that heat dissipation area 12 lies against elevation 13 of support layer 7 with prestressing. Elevation 13 is developed as a sheet metal pot-shaped item or the like, which may be as a strongly heat-dissipating structure.

Outer leg 15 of end region 14 of current bar 5 runs with its outer end region 20 in parallel to contact pin 11, in order to ensure an axially planar lying position against connecting location 16 for the particularly advantageous cross section-sized welding; adjacently to this, during the course of the U-shaped development of end region 14, it runs at an acute angle, so as to achieve an application of force that is as advantageous as possible. In doing this, the attempt is made not to deflect contact pin 11 substantially from its axial extension by the application of the spring force of current bar 5, so as not unnecessarily to stress mechanically its glazing 21 into base plate 9.

In a departure from the specific embodiment shown, it is also possible to carry out construction and mounting methods in which the planes of base plate 9, or heat dissipation area 12, and component lower side 18 do not run in parallel, but are inclined to each other in such a way that they intersect at some distance, going continuously from component 2 to housing 3, and consequently heat dissipation area 12 is inclined relative to component lower side 18. If component 2 is then fastened onto support layer 7 via screw joint 17, the planes are brought to be parallel, in such a way that housing 3 is raised at its side that is at a distance from current bar 5, until the planes run in parallel. In this manner, too, a very good lying position of heat dissipation area 12 on elevation 13 of support layer 7 is achieved, that is prestressed in a springy manner.

It is, of course, also possible to provide a plurality of non-aligned contact pins 11, or rows of contact pins 11, on housing 3 which are connected electrically and mechanically in each case to current bars 5, especially lead frames 6. In this case, it is only essential that the springy design of current bars 5, as well as the difference in planes, as described above, of component lower sides 18, heat dissipation areas 12 and support layer 7 are developed in such a way that the lying of heat dissipation area 12 on support layer 7, that is prestressed in a springy manner, comes about in the fastened state of component 2, without there being too great an undesired mechanical stress of contact pin 11, and particularly its glazing.

What is claimed is:

1. An electrical configuration, comprising:
   a unit including:
      at least one component having at least one current bar; and
      an electronic circuit having at least one heat dissipation surface; and
   at least one electric terminal that is connected mechanically and electrically to the current bar;
   wherein the unit is mounted on a support layer, the component being fastened onto the support layer, thereby pushing the heat dissipation surface against the support layer based on a spring property of the current bar, and thereby affecting heat dissipation.

2. The electrical configuration of claim 1, wherein the current bar is made of a spring material.

3. An electrical configuration of claim 1, wherein the electric terminal is an electric contact pin.

4. The electrical configuration of claim 1, wherein the current bar has a U-shaped end region, whose outer leg is connected to the electric terminal.

5. The electrical configuration of claim 1, wherein the current bar has a leg that is connected to the electric terminal and that runs at least one of (a) parallel to, and (b) at an acute angle to, a longitudinal extension of a contact pin of the electric terminal.

6. The electrical configuration of claim 1, wherein a connection between the electric terminal and the current bar is a welded connection.

7. The electrical configuration of claim 1, wherein the current bar has a U-shaped end region, whose outer leg is connected to the contact pin of the electric terminal.

8. The electrical configuration of claim 1, wherein the at least one current bar includes a lead frame.

* * * * *